United States Patent
Afzali-Ardakani et al.

(10) Patent No.: US 9,502,435 B2
(45) Date of Patent: Nov. 22, 2016

(54) HYBRID HIGH ELECTRON MOBILITY TRANSISTOR AND ACTIVE MATRIX STRUCTURE

(71) Applicant: International Business Machines Corporation, Armonk, NY (US)

(72) Inventors: Ali Afzali-Ardakani, Ossining, NY (US); Bahman Hekmatshoartabari, White Plains, NY (US); Devendra K. Sadana, Pleasantville, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/697,596

(22) Filed: Apr. 27, 2015

(65) Prior Publication Data

US 2016/0315101 A1    Oct. 27, 2016

(51) Int. Cl.

| | |
|---|---|
| *H01L 27/12* | (2006.01) |
| *H01L 29/778* | (2006.01) |
| *H01L 29/40* | (2006.01) |
| *H01L 29/66* | (2006.01) |
| *H01L 29/43* | (2006.01) |

(52) U.S. Cl.
CPC ......... *H01L 27/1214* (2013.01); *H01L 29/408* (2013.01); *H01L 29/435* (2013.01); *H01L 29/66431* (2013.01); *H01L 29/7786* (2013.01)

(58) Field of Classification Search
CPC ........... H01L 27/1214; H01L 29/7786; H01L 51/0508
USPC .......................................... 257/194; 438/172
See application file for complete search history.

(56) References Cited

U.S. PATENT DOCUMENTS

| | | | |
|---|---|---|---|
| 6,384,427 B1 | 5/2002 | Yamazaki | |
| 6,906,458 B2 | 6/2005 | Kobayashi | |
| 7,265,380 B2 | 9/2007 | Kawai et al. | |
| 7,838,883 B2 | 11/2010 | Yamazaki | |
| 8,354,666 B2 | 1/2013 | Lee | |
| 8,367,434 B2 | 2/2013 | Mary | |
| 2002/0044111 A1* | 4/2002 | Yamazaki | G09G 3/3266 345/83 |
| 2003/0230980 A1 | 12/2003 | Forrest | |
| 2005/0275056 A1 | 12/2005 | Forrest | |
| 2006/0197079 A1* | 9/2006 | Suh | H01L 51/0021 257/40 |

(Continued)

OTHER PUBLICATIONS

Chang, Shu-Hsuan et al., Numerical simulation of top-emitting organic light-emitting diodes with electron and hole blocking layers, Proc. of SPIE vol. 6655, 2007.

(Continued)

*Primary Examiner* — Moazzam Hossain
(74) *Attorney, Agent, or Firm* — Louis J. Percello; Otterstedt, Ellenbogen & Kammer, LLP

(57) ABSTRACT

Hybrid high electron mobility field-effect transistors including inorganic channels and organic gate barrier layers are used in some applications for forming high resolution active matrix displays. Arrays of such high electron mobility field-effect transistors are electrically connected to thin film switching transistors and provide high drive currents for passive devices such as organic light emitting diodes. The organic gate barrier layers are operative to suppress both electron and hole transport between the inorganic channel layer and the gate electrodes of the high electron mobility field-effect transistors.

8 Claims, 14 Drawing Sheets

(56) References Cited

U.S. PATENT DOCUMENTS

| | | | | |
|---|---|---|---|---|
| 2009/0146185 A1* | 6/2009 | Suh | H01L 29/2003 | 257/194 |
| 2011/0031532 A1* | 2/2011 | Kikkawa | H01L 29/66462 | 257/194 |
| 2013/0316502 A1* | 11/2013 | Mishra | H01L 29/2003 | 438/172 |
| 2014/0319480 A1* | 10/2014 | Kang | H01L 27/3262 | 257/40 |
| 2015/0235123 A1* | 8/2015 | Afzali-Ardakani | G06N 3/063 | 706/33 |
| 2015/0349127 A1* | 12/2015 | Kurata | H01L 27/1225 | 257/43 |

OTHER PUBLICATIONS

Singh, Thokchom Birendra et al., Bio-Organic Optoelectronic Devices Using DNA, Adv. Polymer Sci., Springer-Verlag Berlin Heidelberg, 2009.

Afazli-Ardakani et al., Hybrid Bipolar Junction Transistor, U.S. Appl. No. 14/184,384, filed Feb. 19, 2014.

Afazli-Ardakani et al., Hybrid Junction Field-Effect Transistor and Active Matrix Structure, U.S. Appl. No. 14/184,488, filed Feb. 19, 2014.

Ali Afzali-Ardakani et al, unpublished U.S. Appl. No. 14/929,354, filed Nov. 1, 2015, 24 pages plus 14 sheets drawings.

List of IBM Patents or Applications Treated as Related.

* cited by examiner

HYBRID HIGH ELECTRON MOBILITY TRANSISTOR AND ACTIVE MATRIX STRUCTURE

FIELD

The present disclosure relates to thin-film electronic device structures and technology and, more particularly, to high electron mobility transistors, active matrix structures such as backplanes incorporating such transistors, and the fabrication of high electron mobility transistors and active matrix structures using both inorganic and organic materials.

BACKGROUND

Field-effect transistors include source, drain and gate structures. A biasing voltage applied across gate and source terminals allows the flow of charge carriers, namely electrons or holes, between source and drain. High electron mobility transistors (HEMTs) are characterized by heterojunctions having different materials on either side of the junctions. Electrons remain close to the heterojunction and form two dimensional electron gas (2DEG). A bias applied to the gate modulates the number of electrons and controls the conductivity of the transistor.

Active matrix devices such as displays (e.g. televisions, laptop monitors), imagers (e.g. x-ray imagers) and sensors typically use hydrogenated amorphous silicon (a-Si:H) and, in some applications, low-temperature poly-silicon (LTPS) thin-film transistor (TFT) backplanes on glass or, for flexible devices, clear plastic. However, for very high resolution applications (>1000 pixels per inch (ppi)), such as microdisplays or pico-projectors, the carrier mobility of a-Si:H (electron mobility of about 1 $cm^2Ns$) is too low to provide sufficient drive current at short TFT channel widths. For applications requiring high drive current, such as active matrix organic light emitting diode (AMOLED) displays, it is necessary to shrink the gate length and/or increase the gate width of a-Si:H transistors. This leads to increasing the processing cost of a-Si:H active matrix circuits due to the relatively small gate lengths as well as a significant trade-off in display resolution due to larger gate widths. LTPS is more expensive than a-Si:H, but capable of providing higher drive currents. The device-to-device variation of threshold voltage and mobility in LTPS transistors requires compensation circuitry that limits the resolution of the active matrix. Single crystalline silicon (c-Si) has been used as an alternative for very high resolution backplanes, but processing c-Si can require high temperatures not compatible with glass substrates currently used in manufacturing a-Si:H or LTPS devices or clear plastic substrates that may be used.

Some existing displays have pixel densities of about 100 PPI (pixels per inch), each pixel including three RGB sub-pixels. Pixel dimensions of such devices may be about one hundred microns (100 μm). Such displays further include organic light emitting diodes (OLEDs) requiring a drive current of about 300 nA for a 100 μm pixel. Amorphous hydrogenated silicon thin film transistors (TFTs) having standard $SiN_x$ gate dielectrics are employed in conjunction with the OLEDs. Using such TFTs, resolutions greater than 150 PPI are difficult.

BRIEF SUMMARY

In accordance with the principles discussed herein, high electron mobility transistors, active matrix structures including such transistors, and methods relating to such transistors and active matrix structures are provided.

A hybrid high electron mobility transistor is disclosed that includes an inorganic semiconductor layer, a gate electrode, first and second ohmic contacts operatively associated with the inorganic semiconductor layer, and an organic gate barrier layer operatively associated with the gate electrode. The organic gate barrier layer is positioned between the gate electrode and the inorganic semiconductor layer and includes one or more organic semiconductor layers operative to block electrons and holes.

An exemplary method includes obtaining a high electron mobility field-effect transistor comprising an inorganic semiconductor layer, a gate electrode, first and second ohmic contacts operatively associated with the inorganic semiconductor layer, and an organic gate barrier layer operatively associated with the gate electrode, the organic gate barrier layer being positioned between the gate electrode and the inorganic semiconductor layer and including one or more organic semiconductor layers operative to block electrons and holes. A two dimensional electron gas layer is formed in the inorganic semiconductor layer between the source and drain electrodes and the high electron mobility field-effect transistor provides electrical current to an electronic device.

An exemplary structure includes an array of high electron mobility field-effect transistors, each of the high electron mobility field-effect transistors including: an inorganic semiconductor layer, a gate electrode, first and second ohmic contacts operatively associated with the inorganic semiconductor layer, and a gate barrier layer operatively associated with the gate electrode, the gate barrier layer being positioned between the gate electrode and the inorganic semiconductor layer and including one or more organic semiconductor layers for suppressing the transport of electrons and holes between the gate electrode and the inorganic semiconductor substrate. The exemplary structure further includes an array of thin film switching transistors, each of the thin film switching transistors being electrically connected to one of the high electron mobility field-effect transistors. An array of electronic devices is electrically connected to the high electron mobility field-effect transistors.

A further exemplary method includes obtaining a substrate including a first inorganic semiconductor layer, a handle substrate, and an electrically insulating layer between the first inorganic semiconductor layer and the handle substrate. A doped, second inorganic semiconductor layer is formed from a region of the handle substrate adjoining the electrically insulating layer. An array of transistors is formed using the first inorganic semiconductor layer. The method further includes forming a plurality of via conductors through the electrically insulating layer, at least some of the via conductors being electrically connected to the transistors, forming a protective layer over the transistors, attaching a support substrate to the protective layer, forming a plurality of discrete active areas from the doped, second inorganic semiconductor layer, and forming an array of high electron mobility field-effect transistors using the discrete active areas. Each junction field-effect transistor includes a gate barrier layer, a gate electrode on the gate barrier layer, and ohmic contacts. Each gate barrier layer includes one or more organic semiconductor layers operative to block electrons and holes. The method further includes forming a second protective layer over the high electron mobility field-effect transistors and forming a plurality of electrical conductors within the second protective layer electrically connecting the high electron mobility field-effect transistors to the via conductors electrically connected to the first array of transistors.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided by the exemplary structures and methods disclosed herein. For example, one or more embodiments may provide one or more of the following advantages:

Enabling higher resolution displays due to relatively high drive current and/or low operation voltage compared to a-Si:H or organic TFTs;
Same fabrication infrastructure for backplane and frontplane structures feasible;
Low-temperature processing compatible with flexible and low-cost substrates;
Larger minimum device feature size (channel length) compared to a-Si:H devices allowing lower lithography costs.
Lower power consumption compared to a-Si:H or organic TFT backplanes due to lower operation voltages.

These and other features and advantages of the disclosed methods and structures will become apparent from the following detailed description of illustrative embodiments thereof, which is to be read in connection with the accompanying drawings.

DETAILED DESCRIPTION

Figure 1:
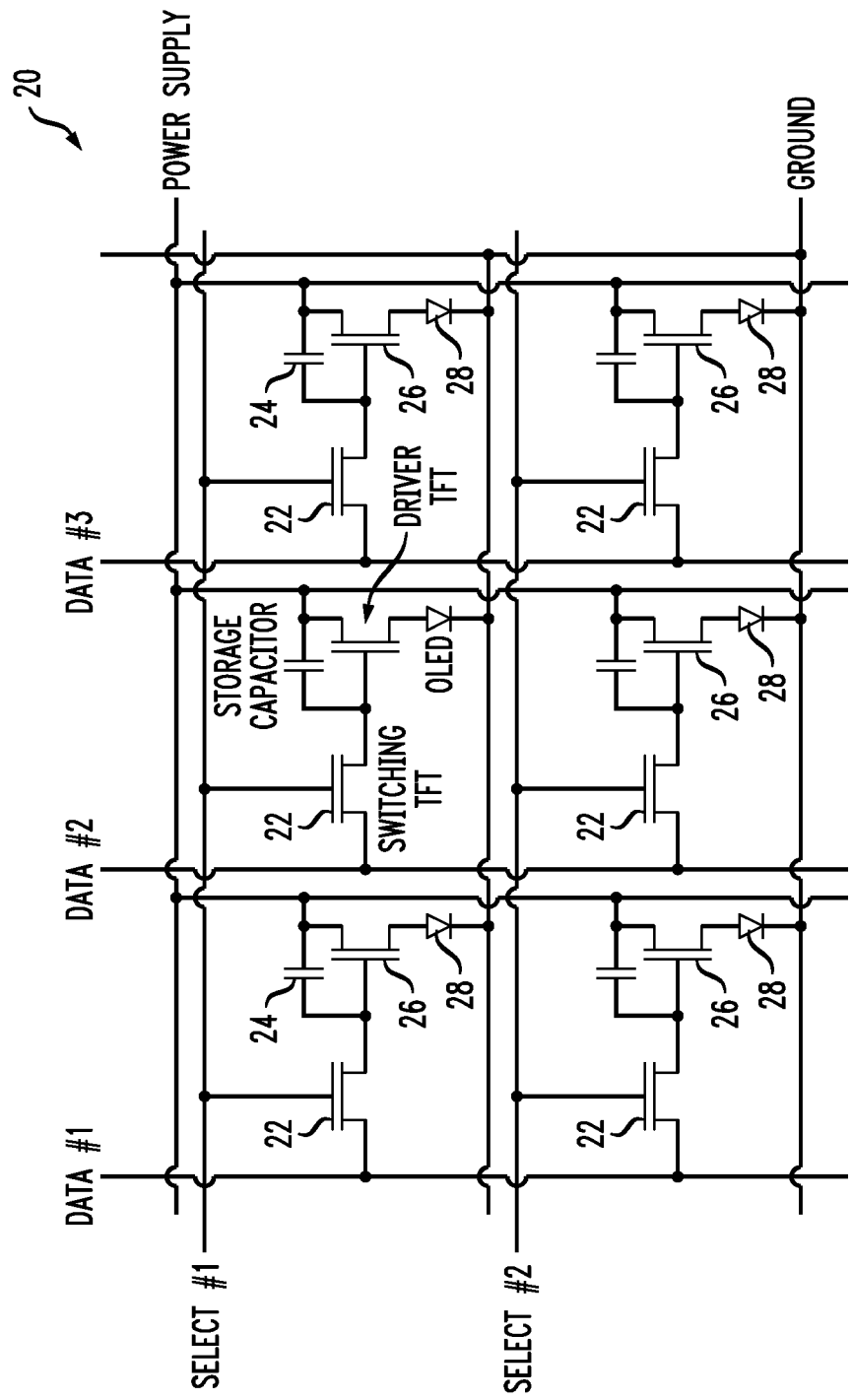
FIG. 1 shows a schematic illustration of active matrix pixel circuits in a TFT/OLED display.

Thin-film hybrid high electron mobility transistors (HEMTs) are disclosed that include crystalline, inorganic semiconductor channels and organic gate barrier layers. Such transistors are used in some embodiments for forming high resolution active matrix displays. A backplane refers to an array of transistors (active devices) used for addressing and programming passive devices such as light emitting diodes, liquid crystal displays, photosensitive materials (e.g. for x-ray imaging), or sensors (e.g. piezoelectric materials for sensing pressure). The backplane also contains address lines, program lines, power supply lines, and typically storage capacitors which are fabricated using the same process technology as that of the transistors. Arrays of passive devices addressed/programmed by the backplane are typically referred to as the frontplane. An active matrix refers to the combination of a backplane and a frontplane. Schematic pixel circuits of active-matrix arrays comprised of OLEDs are illustrated in FIG. 1. An exemplary OLED includes one or more layer(s) of organic electroluminescent material(s) disposed between two electrodes. The circuit 20 illustrated in FIG. 1 is a 3×2 active matrix, i.e. comprised of six (6) pixels. A switching thin film transistor (TFT) 22, a storage capacitor 24, and a driver thin film transistor 26 are operatively associated with an OLED 28. One TFT 22 is employed to start and stop charging of a storage capacitor while the other 26 functions as a current source to provide a constant current for each pixel. The storage capacitor maintains a constant voltage on a charged pixel between refresh cycles. The frontplane of passive elements (OLEDs) is integrated, e.g. laminated, onto a backplane including an array of TFT elements to control current flowing to the passive elements. The select and data lines respectively transfer the switching and programming/readout signals. As discussed below, hybrid driver thin film transistors having crystalline channels and organic barrier layers are disclosed that provide a high and stable drive current for passive devices such as OLEDs, thus allowing high resolution and low power consumption.

High resolution active matrix structures are fabricated using techniques described below. A backplane layer including active semiconductor devices is formed in some embodiments using a semiconductor-on-insulator substrate. The semiconductor-on-insulator substrate may be prepared by various layer transfer techniques known in the art such as controlled spalling, epitaxial layer lift-off or SMART CUT®. In these techniques, a thin layer of crystalline semiconductor is transferred from a host substrate and bonded onto an insulating handle (carrier) substrate. The transfer and/or bonding methods are different in different techniques. Driver transistors as disclosed herein are formed using the semiconductor layer of the substrate along with additional circuit elements that provide other functions such as computing or sensing. In other embodiments, the starting substrate is fabricated by crystallization of non-crystalline materials grown on an insulating substrate using known techniques such as laser crystallization. Substantially higher drive currents and/or lower operation voltages may be obtained compared to a-Si:H or organic TFTs due to the higher mobility of crystalline channels in the driver transistors. As used herein, the term "crystalline" refers to single-crystalline (mono-crystalline), or poly-crystalline (multi-crystalline); the term "non-crystalline" refers to amorphous, nano-crystalline and micro-crystalline.

Figure 2:
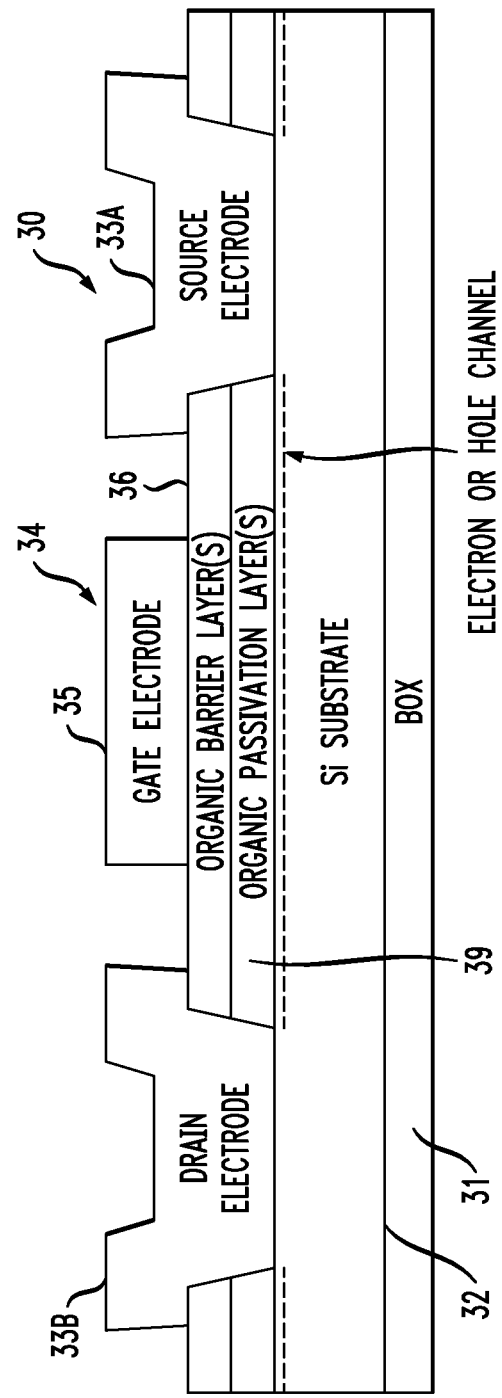
FIG. 2 shows a schematic illustration of a first exemplary high electron mobility field-effect transistor.

FIG. 2 schematically illustrates an exemplary high electron mobility transistor 30 formed using a doped crystalline silicon substrate layer 32. The substrate is undoped or lightly doped n-type in one exemplary embodiment. As used herein, "n-type" refers to the addition of impurities that contribute free electrons to an intrinsic semiconductor. In a silicon containing substrate, examples of n-type dopants, i.e. impurities, include but are not limited to antimony, arsenic and phosphorous. The doped semiconductor layer 32 can be formed as a continuous layer as shown during fabrication of a semiconductor-on-insulator (SOI) wafer. Ion implantation can alternatively be employed following SOI substrate wafer fabrication to form the doped layer. The layer 32 is between 20 nm-1 µm in thickness in one or more embodiments. The doping concentration of the layer 32 is between $10^{15}$ to $10^{19}$ cm$^{-3}$ in one or more embodiments. The transistor 30 includes source and drain electrodes 33A, 33B and a gate stack 34. The source and drain electrodes form ohmic contacts to the silicon substrate layer 32. Metal or low-temperature silicide materials can be employed to form the source and drain electrodes in the exemplary structure. The gate stack 34 includes a gate electrode 35, an organic barrier layer(s) 36, and an organic passivation layer 39. The gate electrode 35 is preferably formed from a high workfunction material such as gold, platinum, palladium or nickel. The barrier layer(s) 36 includes one or more layers of organic semiconductor material. In some embodiments, the barrier layer 36 is comprised of an electron blocking layer and a hole blocking layer. The hole blocking layer in such embodiments adjoins the gate electrode 35 while the electron blocking layer adjoins the passivation layer 39 or the substrate 32 in embodiments wherein a passivation layer is not required. The organic gate stack 34 is analogous to the barrier layer in a conventional HEMT. As such, the overall operation of the hybrid high electron mobility transistor (HEMT) 30 is analogous to that of a conventional HEMT wherein the barrier layer is comprised of an organic gate stack. A channel layer is formed in the inorganic substrate close to the gate stack/substrate interface, as a result of the band gap difference between the inorganic substrate and the organic material(s). The density of the carriers induced in the channel can be modulated by the voltage bias applied to the gate. The electron blocking layer impedes the transfer of electrons between the gate electrode and the substrate, while the hole blocking layer impedes the transfer of holes between the gate electrode and the substrate. The electron blocking layer and the hole blocking layer are both required to ensure low gate leakage at ON and OFF states. In some embodiments, the electron blocking and hole blocking functions are provided by a single organic layer. Moreover, a passivation layer 39 may be optionally employed to further reduce the gate current by saturating the dangling bonds at the surface of the substrate 32. In some embodiments, the passivation layer can have one or more of the following benefits, (i) prevent or suppress the carrier mobility degradation due to surface scattering in the channel, (ii) reduce the subthreshold slope by reducing the parasitic capacitance associated with the surface states, (iii) increase the stability of the threshold voltage and therefore the drive current by preventing or suppressing charge trapping in the surface states, and/or charge trapping within the organic materials assisted by trapping through the surface states. The electron blocking and hole blocking layer(s) contained within the barrier layer 36 is a layer of organic semiconductor material. The passivation layer 39, if employed, is preferably organic. Examples of organic materials which can provide electron blocking (or hole transport) functions include but are not limited to pentacene, rubrene, anthracene, poly(3-hexylthiophene) (P3HT); tetraceno[2,3-b]thiophene; α-sexithiophene; poly(3,3'''-didodecylquaterthiophene); poly(2,5-bis (3-decylthiophen-2-yl)thieno[3,2-b]thiophene); N,N'-Bis(3-methylphenyl)-N,N'-diphenyl-benzidine (TPD); N,N'-Bis (phenanthren-9-yl)-N,N'-bis(phenyl)-benzidine (PAPB); 4,4'-Bis(N-carbazolyl)-1,1'-biphenyl (CBP); 1,3-Bis(N-carbazolyl)benzene (mCp); 4,4'-Cyclohexylidenebis[N,N-bis (4-methylphenyl)benzenamine] (TAPC); 2,2'-Dimethyl-N, N'-di-[(1-naphthyl)-N,N'-diphenyl]-1,1'-biphenyl-4,4'-diamine (α-NPD); 9,9-Dimethyl-N,N'-di(1-naphthyl)-N,N'-diphenyl-9H-fluorene-2,7-diamine (NPB); N,N'-Di-[(1-naphthyl)-N,N'-diphenyl]-1,1'-biphenyl)-4,4'-diamine (NPD); N,N'-Di(2-naphthyl-N,N'-diphenyl)-1,1'-biphenyl-4,4'-diamine (β-NPB); Tri-p-tolylamine; 4,4',4"-Tris[phenyl (m-tolyl)amino]triphenylamine; Tris(4-carbazoyl-9-ylphenyl)amine (TCTA); Tetra-N-phenylbenzidine (TPB); 1,3-Bis(triphenylsilyl)benzene; poly-aniline; poly(3,4-ethylenedioxythiophene); poly(3,4-ethylenedioxythiophene)-poly(styrenesulfonate) (PEDOT: PSS); poly(3,4-ethylenedioxythiophene); tetracyanoethylene; poly(thiophene-3-[2-(2-methoxyethoxy)ethoxy]-2,5-diyl); bis-poly(ethyleneglycol) (PEDOT:PEG); 7,7,8,8-Tetracyanoquinodimethane, and combinations thereof. In preferred embodiments, all the blocking and passivation layers are comprised of organic materials in order to take full advantage of the benefits of organic materials, including low cost and low-temperature processing capability.

In some embodiments, the semiconductor layer 32 is a pure monocrystalline silicon layer doped with an n-type dopant. In other embodiments, the substrate is comprised of other group IV materials such as Ge, SiGe, SiC, SiGeC or GeC. In other embodiments, the substrate is comprised of III-V or II-VI compound semiconductors. The semiconductor layer directly contacts an electrically insulating layer 31. In one or more embodiments, the electrically insulating layer 31 is a buried oxide (BOX) layer. The insulating layer 31 in an exemplary embodiment is between 5-200 nm, but may also be thicker or thinner for some applications. The electrically insulating layer 31 in one exemplary embodiment is comprised of silicon dioxide, though other buried insulators such as boron nitride (BN) and aluminum oxide ($Al_2O_3$) may alternatively be employed in some embodiments. High quality buried oxides are generally characterized by relatively low interface trap densities ($D_{it}$). However, it should be noted that since carrier transport (from source to drain) in the disclosed high electron mobility transistor 30 takes place by majority carriers (electrons), and the minority carriers (holes) are not involved, the device operation is not sensitive to the quality of the buried oxide as characterized by a low Dit. Therefore, a high quality buried oxide is not required. In some embodiments, the insulating layer 31 is comprised of glass or clear plastic.

In some embodiments, the silicon substrate layer 32 is p-type. In a silicon-containing substrate, examples of p-type dopants include but are not limited to boron, aluminum, gallium and indium. The gate electrode 35 in such embodiments is preferably formed from a low workfunction material such as magnesium or erbium. The hole blocking layer is a layer of organic semiconductor material. The electron blocking layer and passivation layer, if employed, are preferably organic. In some embodiments, some or all of the electron blocking, hole blocking and passivation functions are served by a single layer. The operation of the device using the p-type substrate layer is the same as that of with the opposite carrier types involved. Examples of organic materials which can provide hole blocking (or electron transport) functions include but are not limited to bathocuproine (BCP); bathophenanthroline (BPhen); 3-(Biphenyl-4-yl)-5-(4-tert-butylphenyl)-4-phenyl-4H-1,2,4-triazole (TAZ); 2-(4-Biphenylyl)-5-phenyl-1,3,4-oxadiazole (PBD); bis(8-hydroxy-2-methylquinoline)-(4-phenylphenoxy)aluminum; 2,5-Bis(1-naphthyl)-1,3,4-oxadiazole (BND); 2-(4-tert-Butylphenyl)-5-(4-biphenylyl)-1,3,4-oxadiazole (Butyl-PBD); Tris-(8-hydroxyquinoline)aluminum (Alq3); hexadecafluoro copper phthalocyanine ($F_{16}CuPc$); naphthalene diimide derivatives; perylene diimide derivatives; $C_{60}$; and combinations thereof.

Figure 3A:
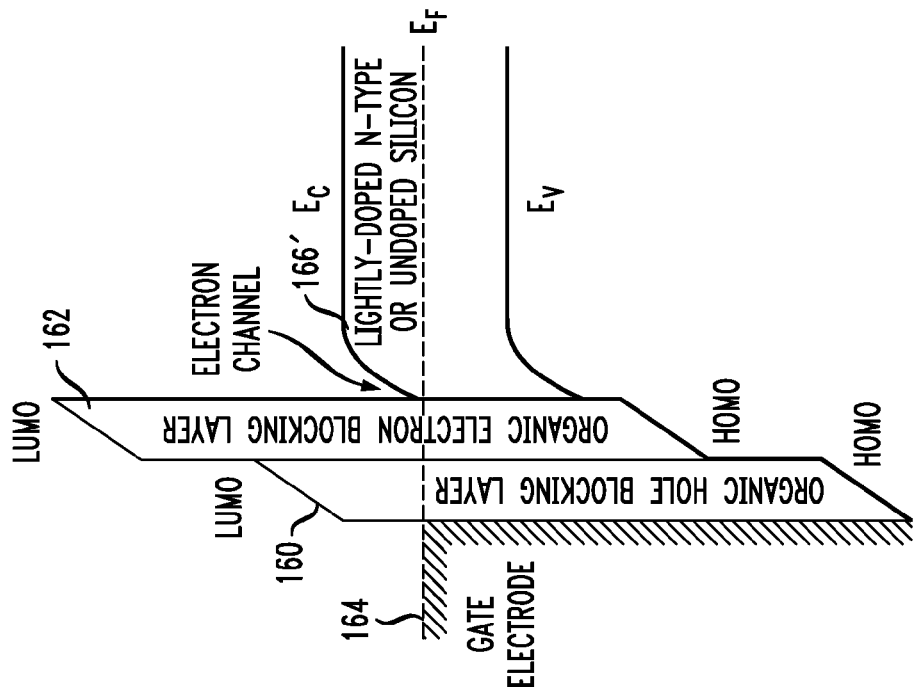
FIG. 3A schematically illustrates an organic barrier bilayer and energy bands obtained using a p-type silicon channel layer.
Figure 3B:
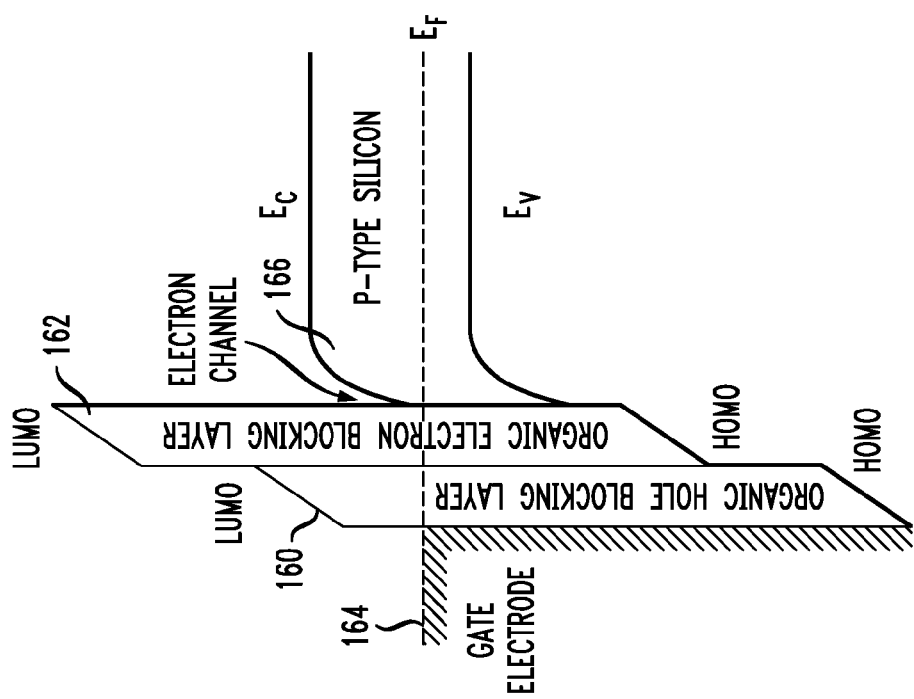
FIG. 3B schematically illustrates an organic barrier bilayer and energy bands obtained using an n-type silicon channel layer.

FIGS. 3A and 3B schematically illustrate inversion-type and accumulation-type high electron mobility transistors. Both exemplary embodiments include a barrier layer that comprises an organic hole blocking layer 160 and an organic electron blocking layer 162. In each embodiment, the hole blocking layer 160 adjoins a gate electrode 164 and the electron blocking layer adjoins the silicon channel. Referring first to FIG. 3A, the inversion-type transistor is characterized by a p-type silicon channel layer 166. The energy bands (Fermi, valence and conduction) associated with the HEMT are further indicated in FIG. 3A. The lowest unoccupied molecular orbitals (LUMO) and highest occupied molecular orbitals are also schematically illustrated. FIG. 3B shows an accumulation-type HEMT that includes a lightly doped or undoped silicon channel layer 166'. The associated energy band diagram shows the closer proximity of the conduction band $E_c$ to the Fermi level as compared to that of the HEMT having the p-type silicon channel. The electron blocking layer 162 blocks electrons from escaping the channel towards the gate electrode 164. The hole blocking layer 160 blocks holes from being injected from the gate electrode into the channel and recombining with (annihilating) electrons in the channel.

Figure 4:
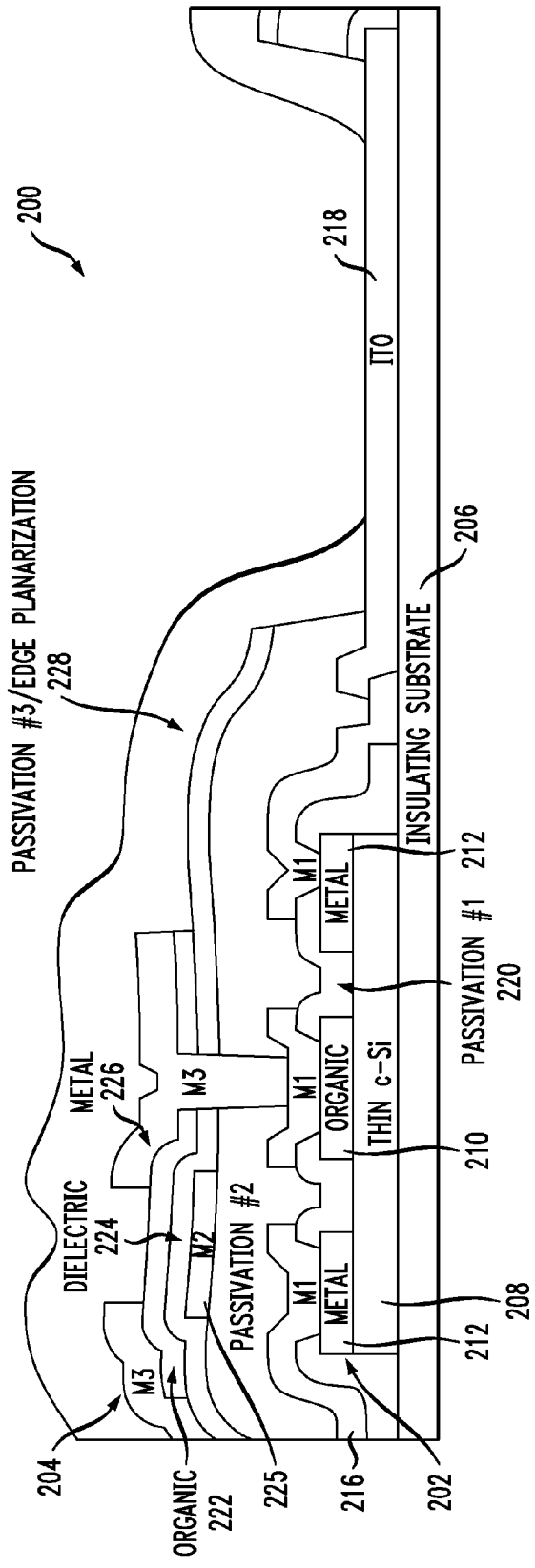
FIG. 4 is a schematic illustration of an exemplary backplane structure including an inverted-staggered bottom gate organic thin film transistor.

An exemplary vertically integrated backplane 200 including high electron mobility driver transistors 202 is schematically shown in FIG. 4. In this exemplary embodiment, an organic thin film transistor 204, which functions as a switch, is integrated on top of each high electron mobility transistor 202. The high electron mobility transistors 202 function as driver transistors for passive devices, such as the OLEDs. The active devices are formed on an insulating substrate 206. A thin, doped (e.g. n-type) crystalline silicon layer 208 adjoins the substrate 206. As discussed above with respect to FIG. 2, the silicon layer 208 can be n-type or p-type. Organic gate junctions 210 are formed on the silicon layer 208. The organic gate junctions correspond to passivation, hole blocking, and electron blocking layers such as those described above with respect to FIG. 2 in some embodiments wherein the electron blocking layer is organic. The other layers of the gate junctions 210, which are optional, are also preferably organic. The metal layer 216 (M1) is electrically connected to the ohmic contacts 212 and the organic gate junctions of the driver transistors 202. Each high electron mobility transistor 202 is electrically connected to an indium tin oxide (ITO) electrode 218. A first passivation layer 220 is formed on the silicon layer 208. The organic thin film transistors 204 in this exemplary embodiment are inverted-staggered bottom-gate devices. They include channels comprised of organic layers 222 and dielectric layers 224 formed between the channel layers and a metal layer 225. The transistors 204 are electrically connected to the drive transistors 202 by a metal layer 226 (M3). The drain of each transistor 204 is electrically connected to the gate electrode of one of the hybrid high electron mobility transistors 202 in the exemplary embodiment as shown. The transistors 202, 204 are incorporated in a circuit as shown in FIG. 1 in some embodiments. A third passivation layer 228 is formed over thin film (switching) transistors 204. The passivation layers 220, 221 and 228 are comprised of insulating materials which may or may not be organic. Inorganic passivation layers are preferably grown by thermal evaporation, e-beam evaporation or atomic layer deposition to avoid the use of plasma which may damage organic materials; however the growth methods involving plasma such as PECVD or sputtering may be used in some embodiments. Examples of inorganic insulators include but are not limited to silicon dioxide, silicon nitride, aluminum oxide, hafnium oxide or combinations thereof. Organic passivation layers are typically grown by thermal evaporation or spun from a solution. Examples of organic insulating materials that can be employed for one or more of the passivation layers include but are not limited to parylene, polyimide, polystyrene and polyvinyl alcohol (PVA). In some embodiments, the organic insulating materials may include a photo-sensitizing material to facilitate the patterning of these materials using photolithography. In one example, ammonium dichromate is used as a photo-sensitizer in a PVA solution and applied by spin coating. In some embodiments the passivation layer 228 may also serve as an edge planarization layer to avoid shorts between the OLED cathode (not shown) and the OLED anode, layer 218 (e.g. ITO). In some embodiments edge planarization may be facilitated by a reflow process which involves low temperature annealing of a polymeric passivation layer after spin-coating and patterning the polymeric passivation layer. Amorphous silicon is not required in the exemplary backplane. The fill factor of each pixel is improved by reducing the active device area, thus providing more area for the OLED (not shown) operatively associated with each switching and driver transistor. It will be appreciated that, in alternative embodiments of the backplane, the organic thin film transistors 204 may be incorporated on the side rather than on top of the electrically associated drive transistors 202.

Figure 5:
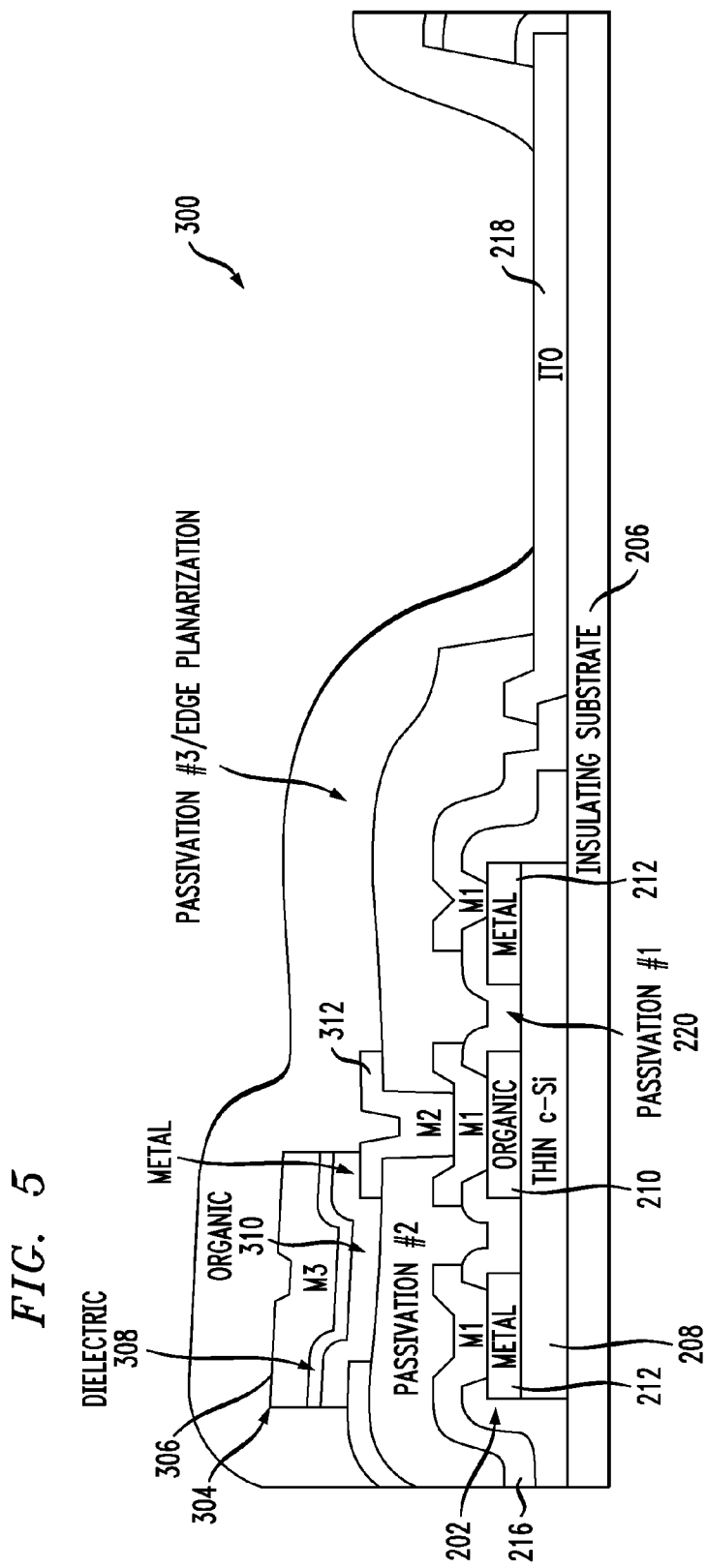
FIG. 5 is a schematic illustration of an exemplary backplane structure including a top-gate staggered bottom gate organic thin film transistor.
Figure 6:
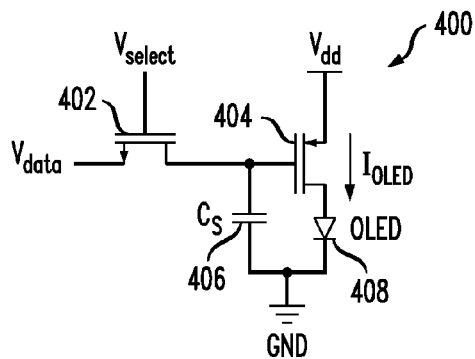
FIG. 6 is a circuit diagram showing a first exemplary pixel circuit.

A second exemplary vertically integrated backplane 300 is shown in FIG. 5. The backplane 300 includes elements that are also found in the backplane 200 discussed above and are designated with the same reference numerals. In this exemplary embodiment, a top-gate staggered organic thin film transistor 304 is electrically connected to a thin-film drive transistor 202. A metal layer 306 (M3) adjoins a gate dielectric layer 308. Materials such as silicon dioxide or high-k materials such as $HfO_2$ or $Al_2O_3$ can be employed as gate dielectric layers. Organic dielectric layers such as parylene and polyimide are used in some embodiments. An organic channel layer 310 adjoins the gate dielectric layer.

Each thin film switching transistor 304 is electrically connected to the gate electrode of a drive transistor 202 by a second metal layer 312.

FIGS. 6-9 show exemplary pixel circuits including hybrid HEMTs as described herein. It will be appreciated that other pixel circuits are familiar to those of skill in the art and that one or more of the exemplary HEMTs may be incorporated in such pixel circuits or those developed in the future. The exemplary circuit 400 shown in FIG. 6 includes switch and driver thin film transistors 402, 404 wherein at least the driver transistor is a HEMT having one or more organic semiconductor layers that provide electron blocking and hole blocking functions, and a storage capacitor 406. The driver TFT 404 is connected to an OLED anode, the OLED cathode being connected to ground. A power supply voltage $V_{dd}$ is applied to the driver TFT. Direct programming is possible using such a circuit. In this embodiment, $I_{OLED} \approx k \cdot (V_{dd} - V_{data} + V_T)_2$ where $V_T$ and k are the threshold voltage and transconductance parameter for the HEMT transistor 404. (Direct programming means the OLED current ($I_{OLED}$) can be set by the driver transistor (i.e. HEMT 404) independent of the OLED voltage ($V_{OLED}$). This is the case in this exemplary embodiment, as $V_{OLED}$ is not present in the above equation. The circuit may be employed, for example, in conjunction with a standard bottom-emission OLED 408.

Figure 7:
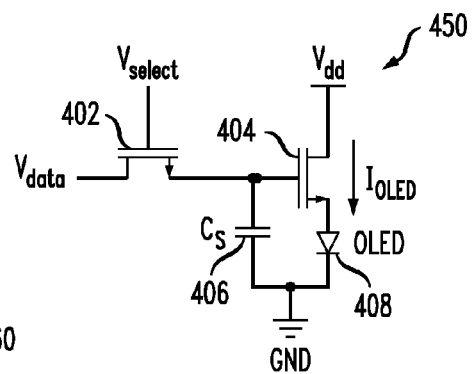
FIG. 7 is a circuit diagram showing a second exemplary pixel circuit.

FIG. 7 shows a further exemplary pixel circuit 450 including a driver hybrid HEMT 404 connected to an OLED anode. While a bottom-emission OLED 408 can be employed within the circuit, direct programming is not possible. In this embodiment, $I_{OLED} \approx k \cdot (V_{data} - V_{OLED} - V_T)^2$ where $V_T$ and k are the threshold voltage and transconductance parameter for the HEMT 404, respectively.

Figure 8:
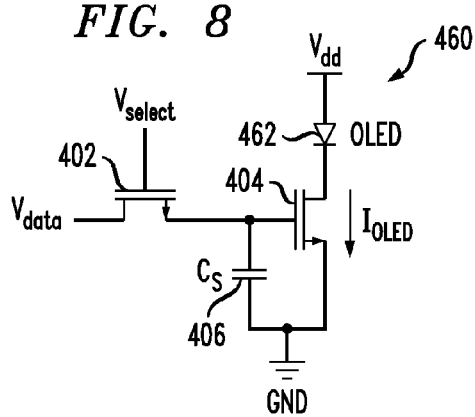
FIG. 8 is a circuit diagram showing a third exemplary pixel circuit.

FIG. 8 shows a further exemplary pixel circuit 460 including a driver TFT 404 connected to an OLED cathode. Direct programming is possible using such a circuit 460, but a top emission OLED 462 is required. In this embodiment, $I_{OLED} \approx k \cdot (V_{data} - V_T)^2$. $V_T$ and k are the threshold voltage and transconductance parameter for the hybrid HEMT 404, respectively.

Figure 9:
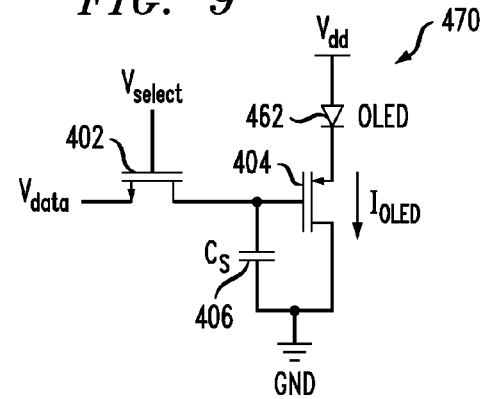
FIG. 9 is a circuit diagram showing a fourth exemplary pixel circuit.

FIG. 9 shows a further exemplary pixel circuit 470 including a driver TFT 404 connected to an OLED cathode. Direct programming is not possible using such a circuit 470 and a top emission OLED 462 is required. $I_{OLED} \approx k \cdot (V_{dd} - V_{data} - V_{OLED} + V_T)^2$ in this exemplary circuit.

Figure 10:
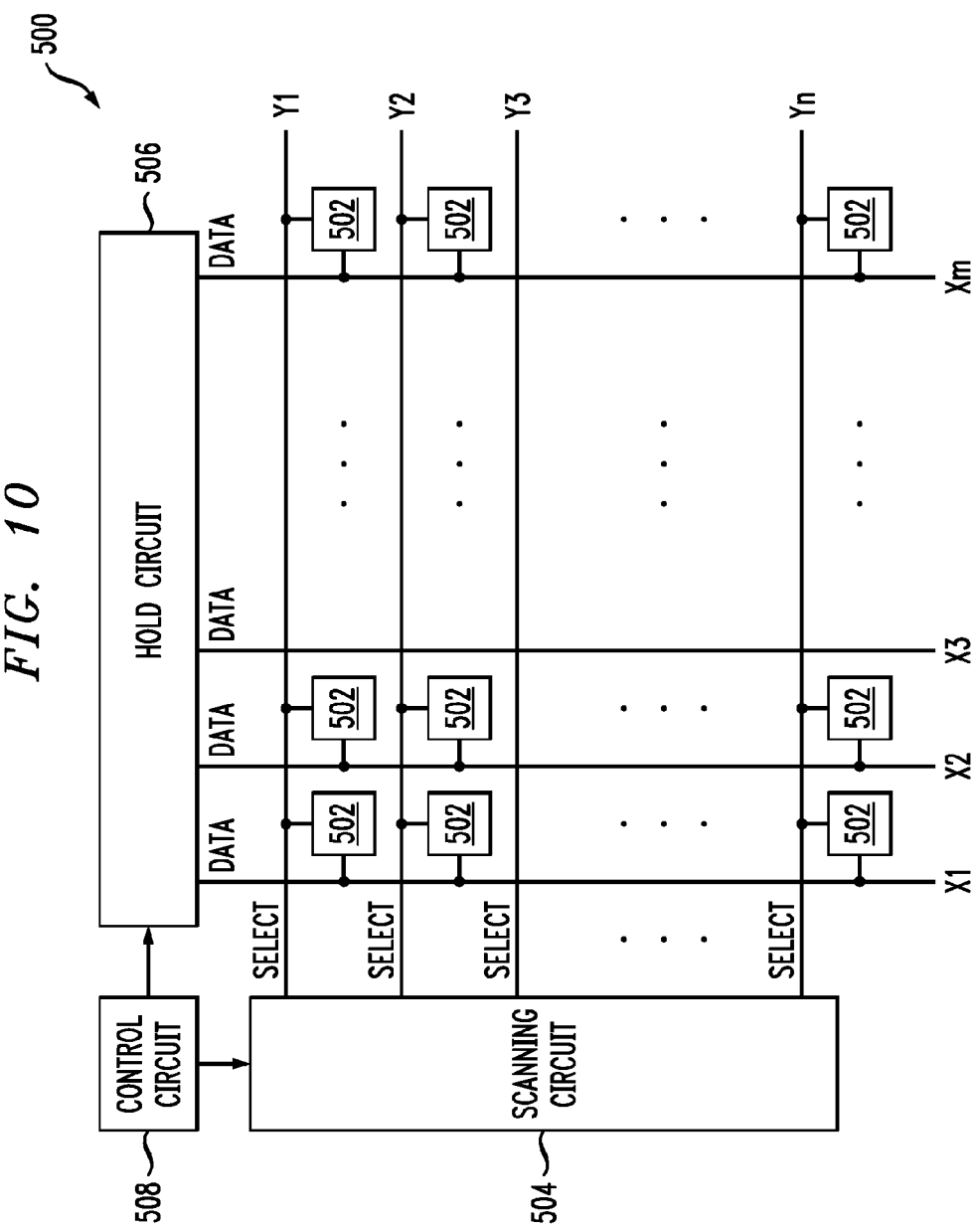
FIG. 10 is a schematic illustration of an exemplary active matrix display.

FIG. 10 shows a schematic illustration of an exemplary active matrix display 500 having pixel circuits 502 including HEMT drive transistors having organic gate barrier layers and crystalline inorganic channels as described above. The display includes a scanning circuit 504, a hold circuit 506 and a control circuit 508 operatively associated with the scanning and hold circuits. During a scan period, scan signals ("select") are generated that cause switching transistor(s) to be turned on. The data signals cause the charging of the storage capacitors within the pixel circuits that have received the scan signals. The switching transistors are turned off by scan signals at the end of the scan period, cutting off the data signals. The storage capacitors provide electrical current to the HEMT drive transistors until the next scan period. In accordance with one or more exemplary embodiments, the scanning circuit, hold circuit and control circuit of the active matrix display 500 are fabricated using CMOS technology familiar to those of skill in the art. The pixel circuits incorporated within the backplane of the active matrix display are fabricated using a doped, crystalline inorganic semiconductor layer such as a c-Si layer to form channel layers and organic material(s) to form gate junctions of at least the driver transistors within the pixel circuits. In some embodiments, both the switching and driver transistors are formed as hybrid HEMTs having inorganic channels and organic gate junctions. In other embodiments, the driver transistors are formed as hybrid HEMTs while the switching transistors are formed as organic TFTs. In some exemplary embodiments, the same infrastructure used for OLED growth is used for the growth of the organic gate junctions within the pixel circuits, eliminating the need for infrastructure required for a-Si:H deposition.

Figure 11:
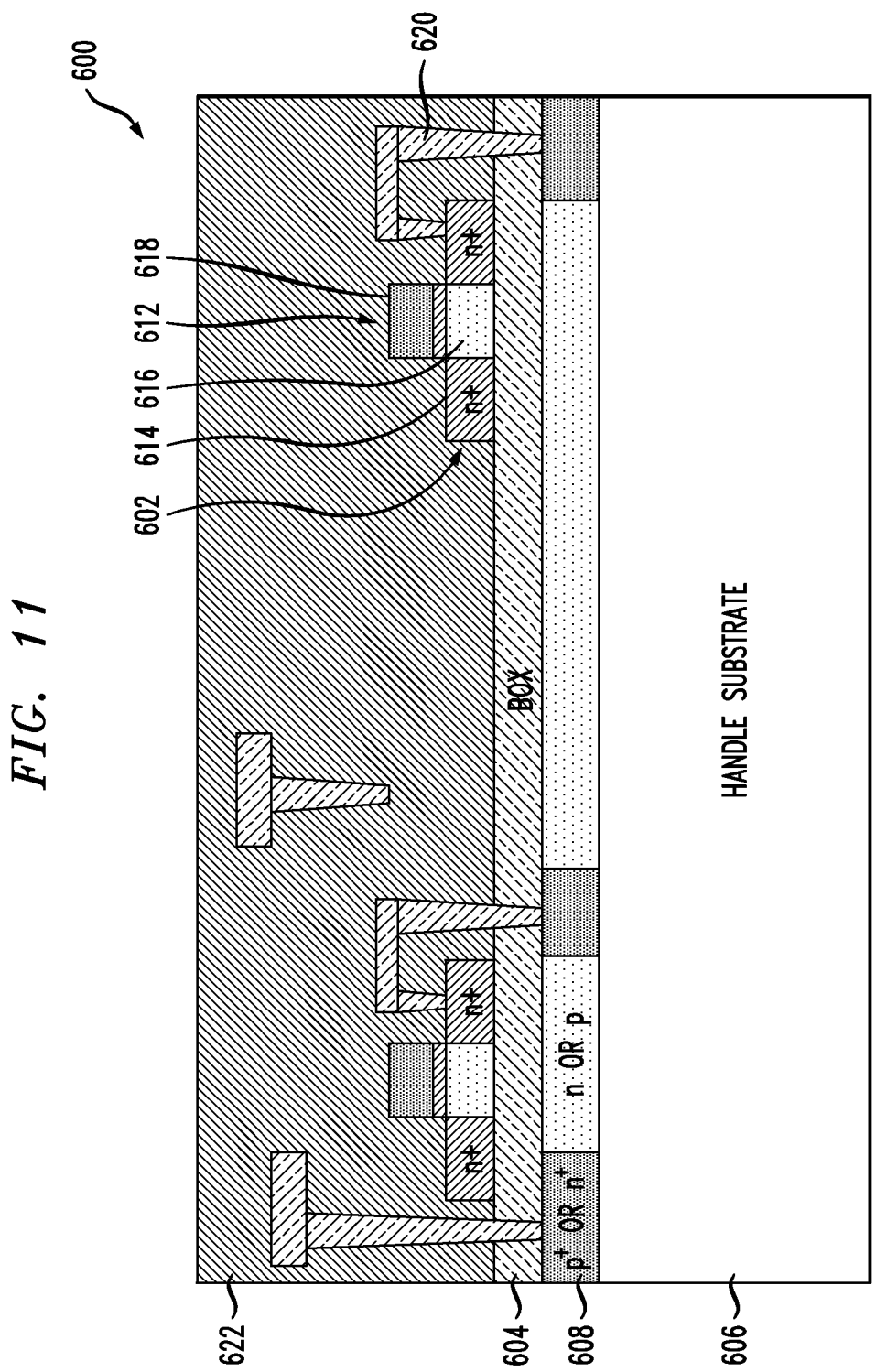
FIG. 11 is a schematic, sectional illustration showing a first structure obtained in fabricating an exemplary active matrix structure.

A silicon-on-insulator (SOI) wafer comprised of a thin crystalline semiconductor layer 602 on a buried oxide (BOX) insulator 604, which is in turn on a bulk silicon (handle) substrate 606 is employed in some embodiments as a starting substrate for fabricating backplanes including hybrid high electron mobility transistors, such as the transistors described above with respect to FIG. 2. The hybrid transistors are characterized by their inclusion of inorganic (e.g. silicon-containing) channel layers and organic semiconductor gate junction layer(s). The thickness of the semiconductor layer 602 is between 20 nm-1 μm in some exemplary embodiments although thinner or thicker layers may be used as well. Relatively thin semiconductor layers facilitate the production of mechanically flexible active matrix structures. Exemplary single crystal materials for the crystalline semiconductor layer include silicon and silicon-containing films such as silicon germanium. Compound III-V and II-VI semiconductors may also be used. The insulator layer 604 in an exemplary embodiment is between 5-200 nm, but may also be thicker or thinner for some applications. The handle substrate 606 is subject to ion implantation through the BOX layer 604 to form an n or p-type semiconductor layer 608 beneath the BOX layer. Optionally, n+ or p+ contact regions 610 are also formed within the handle substrate via ion implantation. In one or more exemplary embodiments, boron or phosphorus doping (preferably greater than $10^{19}$ cm$^{-3}$ and more preferably greater than $10^{20}$ cm$^{-3}$) may be provided at selected areas of the handle substrate during fabrication of the SOI wafer 30 or prior to formation of the backplane components to form the highly doped contact regions 610. Ion implantation conducted through a mask can be employed to form the doped regions. The contact regions 610 are between 1-5 μm in depth in a crystalline silicon handle substrate in one or more embodiments. Conventional CMOS fabrication techniques are employed to form an array of transistors 612 on the wafer. The transistors 612 depicted in the exemplary structure 600 shown in FIG. 18 include doped source/drain regions 614 and a channel region 616 formed using the semiconductor layer 602 and a gate stack 618 on the channel region. Through silicon vias (TSVs) are formed. Metallization through the BOX layer 604 provides electrical connections 620 between the transistors 612 and the electrically conductive n+ or p+ regions 610. An electrically insulating layer 622 (e.g. dielectric material such as silicon dioxide) is formed on the wafer with additional metal layers as required. The exemplary structure 600 is thereby obtained, as schematically illustrated in FIG. 11. Ion implantation of the semiconductor layer may be employed for the forming source/drain regions 614 while the regions of the semiconductor layer to be used as the channel regions 616 are protected by a mask. A high-k gate dielectric material is deposited and metal gate layers are formed to provide the gate stacks 618. The semiconductor layer is etched to form isolated portions ("islands") that define the active regions of the backplane. Device isolation is typically performed as one of the first steps in CMOS processing. Back end of line (BEOL) processing is conducted to form via conductors and other metal layers within a dielectric layer 622 serving as a passivation and/or planarization layer to form a backplane structure.

Figure 12:
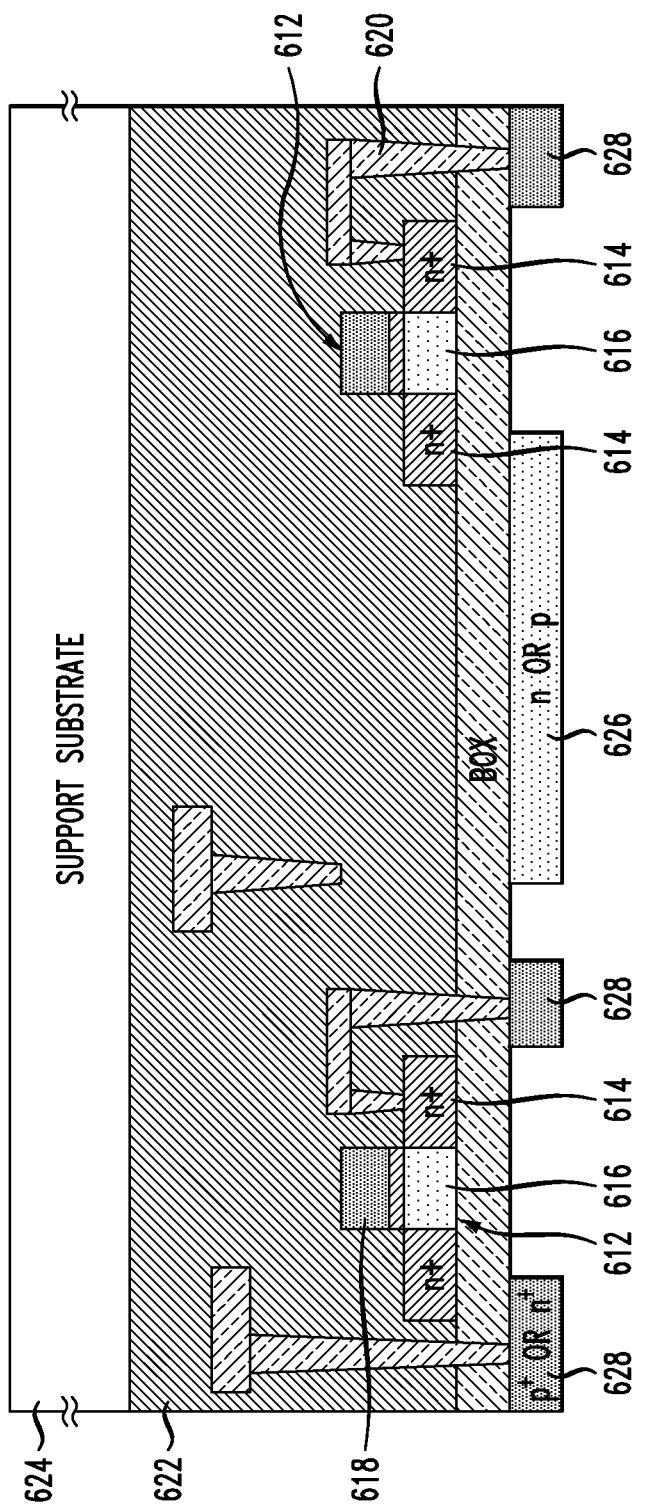
FIG. 12 is a schematic, sectional illustration showing a second structure obtained in fabricating an exemplary active matrix structure.

Referring to FIG. 12, a support substrate 624 is attached (e.g. bonded) to the electrically insulating layer 622 of the structure 600. The support substrate is preferably comprised of a flexible material such as plastic or metal foil in order to enable a flexible display; however, rigid substrates such as glass may also be used to form a rigid (non-flexible) display. The handle substrate 606 is removed back to the ion-implanted semiconductor layer 608. Such removal can be effected by a lapping process followed by chemical mechanical polishing (CMP) and/or etching. Controlled spalling followed by etching is another process for removing handle substrate material. If controlled spalling is employed, the support substrate 624 in some embodiments includes a stressor metal layer(s) (e.g. nickel) and a flexible handle substrate such as a polyimide layer. An optional insulator layer may be provided to prevent contact of the stressor layer with the electrically conductive elements of the backplane formed during BEOL (back end of line) processing. The flexible handle substrate (e.g. polyimide) is then used for detaching a thin layer of Si by spalling through the handle substrate 606. The proper amount of stress to be applied to effect spalling at a desired location in the handle substrate may vary depending on the construction of the portion of the backplane structure that includes the transistors 612.

As discussed above, controlled spalling is facilitated by selecting an appropriate insulating layer. If the electrically insulating layer 622 has a fracture toughness value comparable to silicon, to the first order, the silicon/insulator stack of the exemplary structure can be treated as a single layer in calculating the depth of fracture as a function of stress applied by the stressor layer(s). Therefore, a proper amount of stress can be considered for a desired fracture depth. If the insulating layer 622 has a toughness value larger than that of silicon, the fracture will occur inside the silicon. However, the insulating layer should not have a toughness value materially smaller than that of silicon (or other substrate material, if employed) because the fracture will occur within the insulating layer 622 instead of in the silicon handle substrate. The thickness of the metal stressor layer is an additional factor in determining where the fracture will occur in the substrate. Following spalling from the handle substrate, a thin residual silicon layer that includes the semiconductor layer 608 including the highly doped regions remains beneath the electrically insulating (BOX) layer. Stress-induced substrate spalling is disclosed in U.S. Pat. No. 8,247,261, which is incorporated by reference herein. The thin Si residual layer spalled from the handle substrate 606 is then removed using known techniques, e.g. by selective wet or dry etching. The doped semiconductor layer 608, including the optional highly doped regions 610, remains following such selective etching. The use of a p-type layer 608 facilitates the etching process in some embodiments as it functions as an etch stop layer. Techniques for removing the residual silicon layer include reactive ion etch and wet etch in TMAH or KOH (tetramethyl-ammonium hydroxide or potassium hydroxide). The semiconductor layer is then patterned into active areas 626 and contact regions 628, the contact regions 628 being comprised of the previously formed highly doped regions 610.

Figure 13:
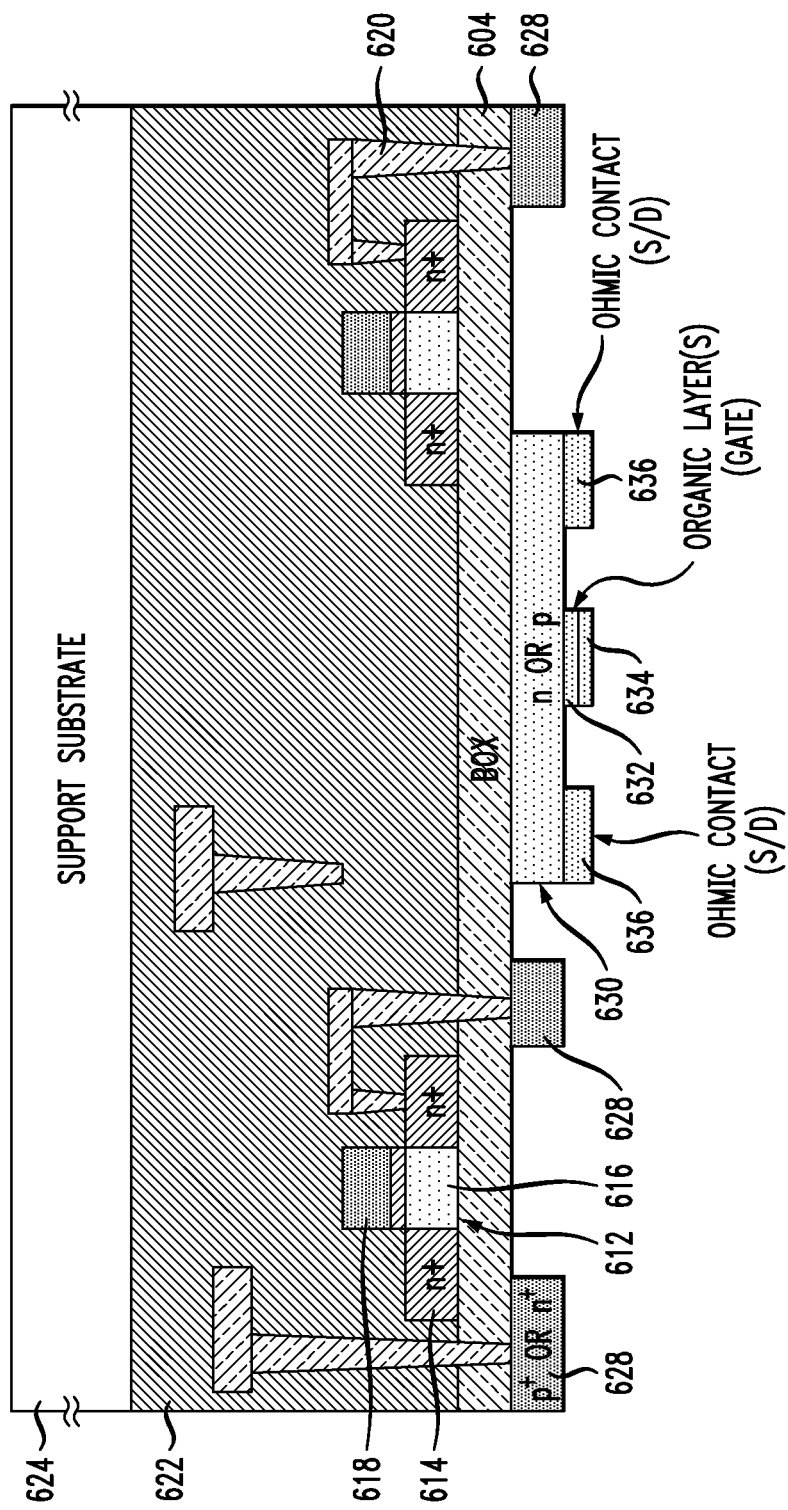
FIG. 13 is a schematic, sectional illustration showing a third structure obtained in fabricating an exemplary active matrix structure.

Referring to FIG. 13, hybrid HEMTs 630 are formed on the active areas 626. In forming the HEMTs, organic layer(s) 632 and a gate electrode 634 are formed on each active area. FIG. 2 shows an exemplary organic gate junction structure including barrier and optional passivation layers. Ohmic contacts 636 are formed on the active areas. The exposed surfaces of the active areas are cleaned to remove the native oxide using, for example, hydrofluoric acid. Contact metal is deposited using one of several known techniques such as chemical vapor deposition (CVD), evaporation and sputtering. The contact metal may be deposited within a patterned photoresist layer (not shown) that is subsequently removed. Preferably a low workfunction metal such as erbium or magnesium is used to form ohmic contact to n-type silicon while a high workfunction metal such as gold, platinum, palladium or nickel is used to form ohmic contact to p-type silicon. Due to the high cost of rare and precious metals, in some embodiments, a thin layer of these materials (e.g. <3 nm) is deposited followed by a less expensive metal such as aluminum, chrome, titanium, copper or combinations thereof. The deposited contacts are optionally subjected to annealing up to a temperature compatible with the support substrate and the material used for bonding the support substrate (e.g. an adhesive material). In some embodiments, the optional annealing process may form a silicide.

Figure 14:
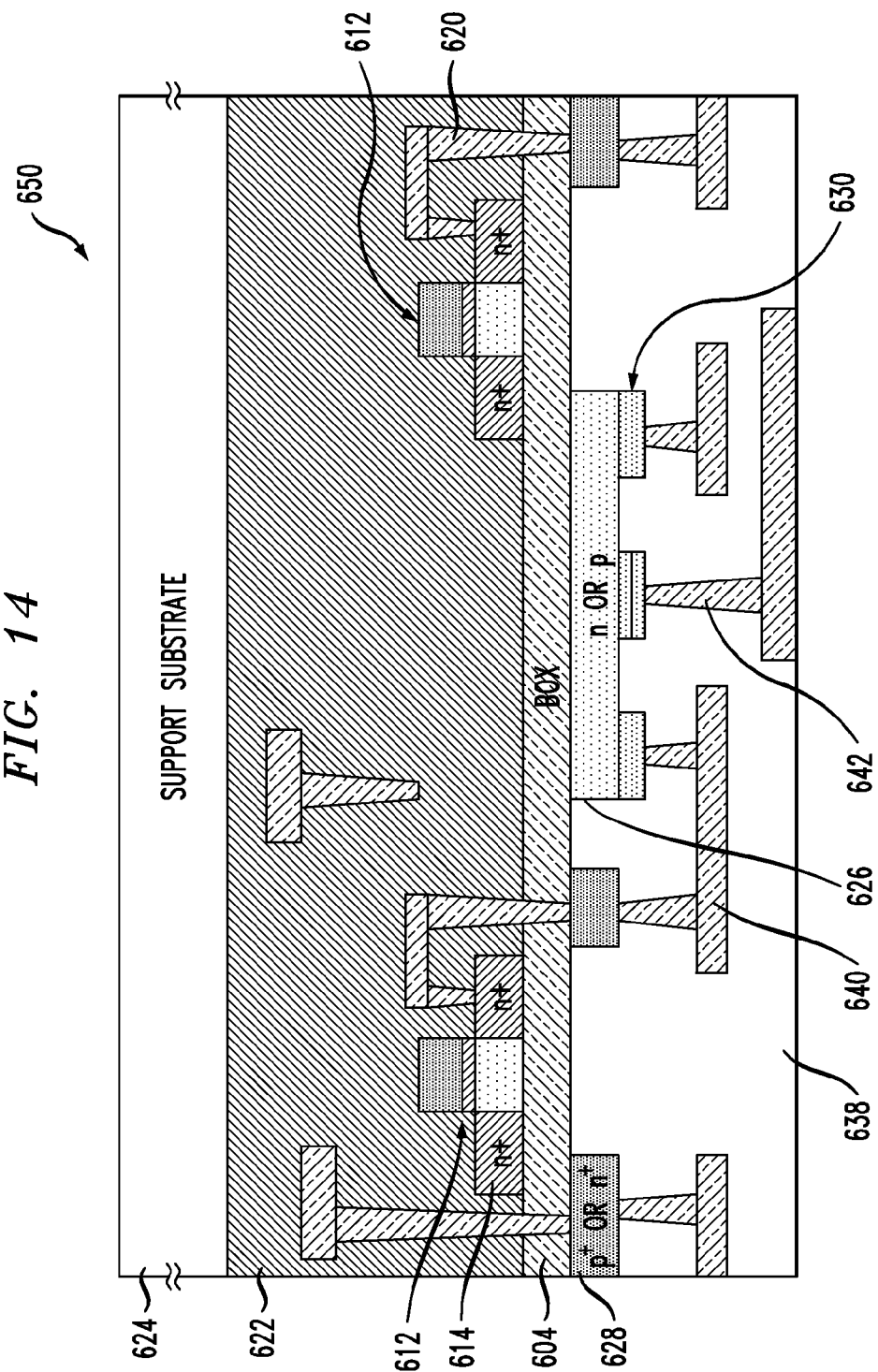
FIG. 14 is a schematic, sectional illustration showing a fourth structure obtained in fabricating an exemplary active matrix structure.

Following formation of an array of the JFETs 630, passivation and metallization steps are performed to provide a passivation layer 638 having metal layers 640 and via conductors 642. The JFETs 630, which function as the driver and/or switching transistors of the resulting backplane 650 shown in FIG. 14, are thereby electrically connected to the transistors (e.g. MOSFETs) on the opposite side of the BOX layer which form the control, hold and/or the scanning circuitry.

Figure 15:
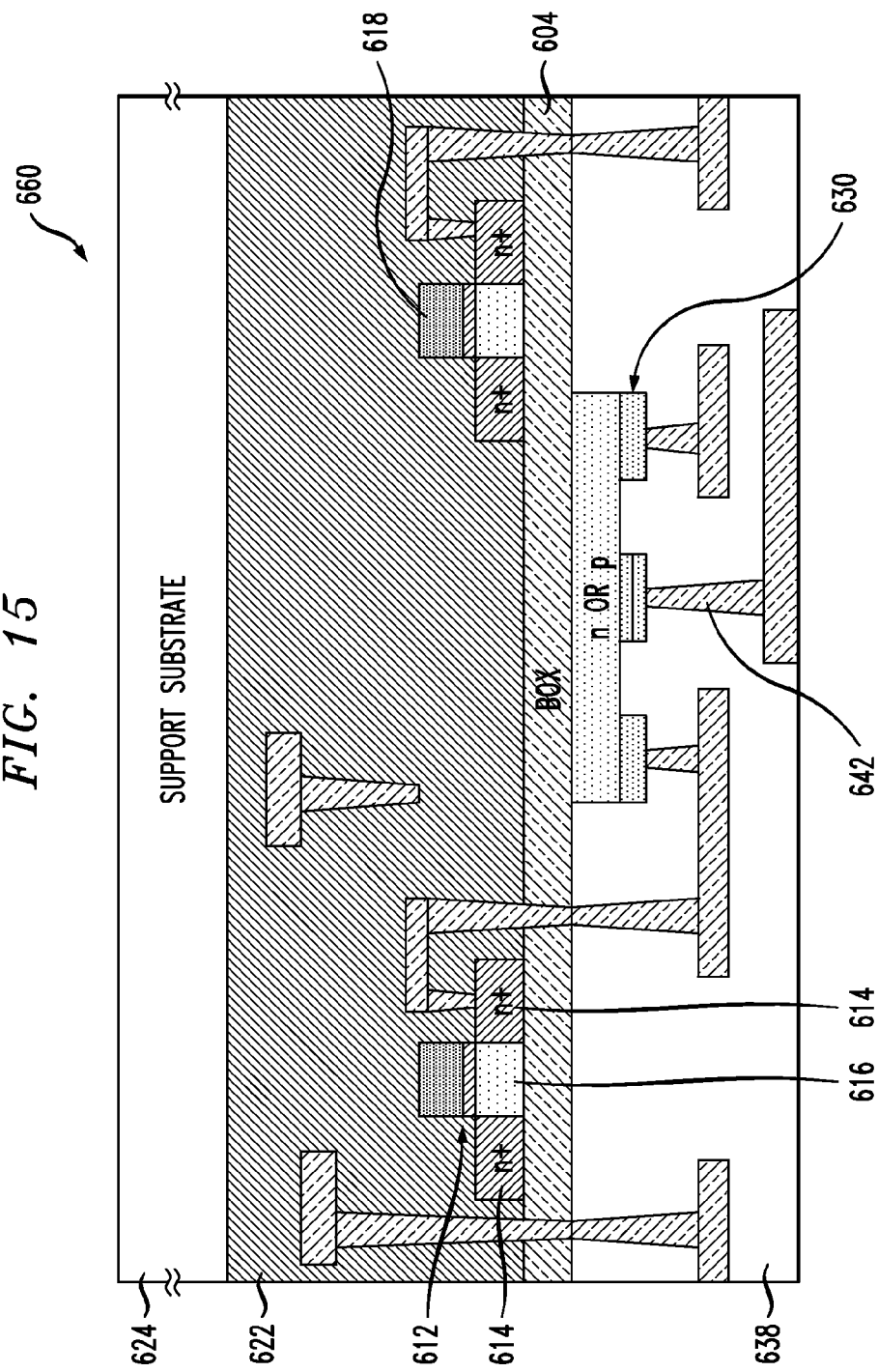
FIG. 15 is a schematic, sectional illustration showing a first alternative embodiment of an active matrix structure.

FIG. 15 shows an alternative embodiment of a backplane 660 provided in accordance with one or more embodiments. The same reference numerals used in the schematic illustration of the backplane 650 are employed to designate similar elements. In this exemplary embodiment, the highly doped contact regions 628 are omitted and direct metal-to-metal contact is made between via conductors formed on each side of the BOX layer.

Figure 16:
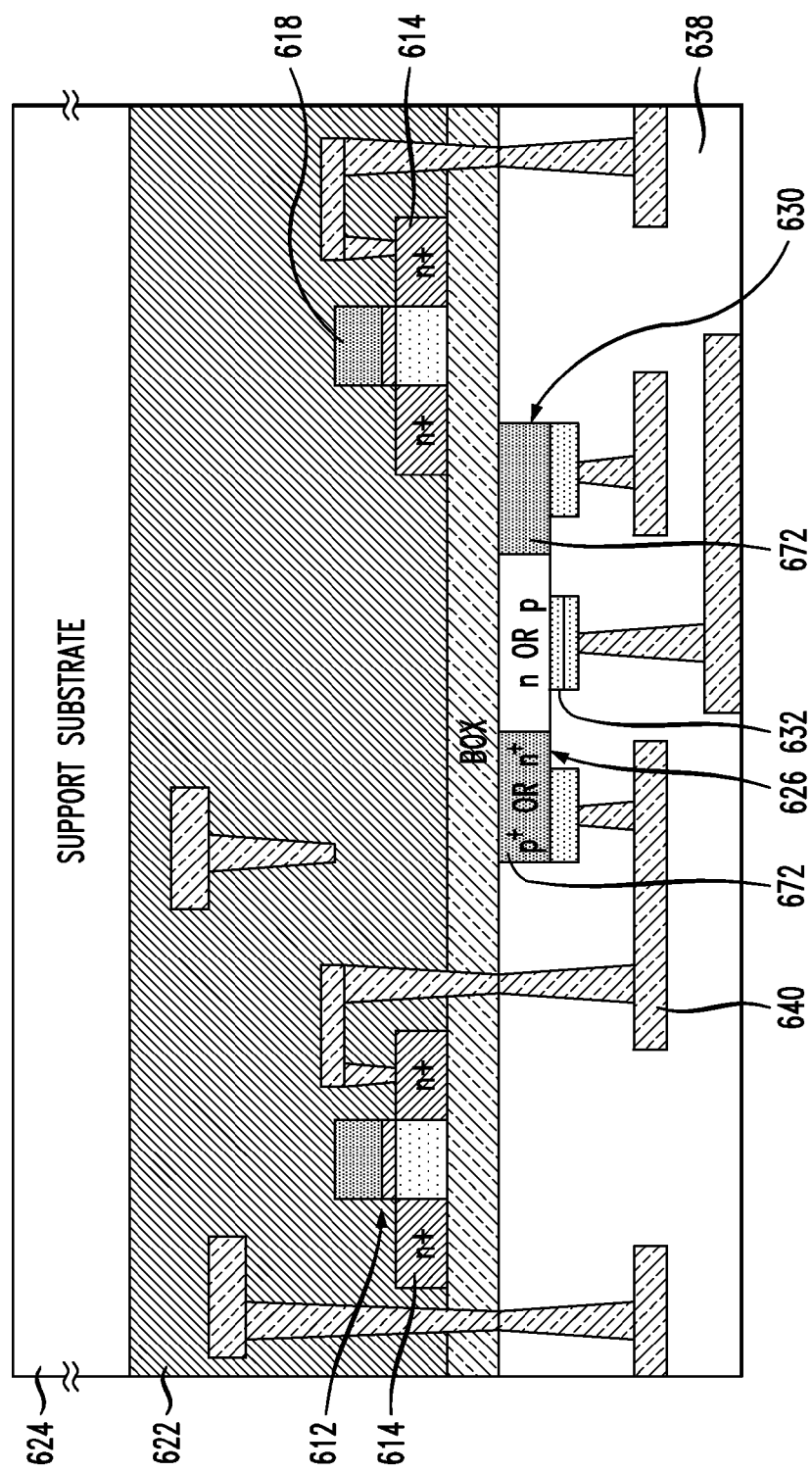
FIG. 16 is a schematic, sectional illustration showing a second alternative embodiment of an active matrix structure.

FIG. 16 shows a further alternative embodiment of a backplane 670 provided in accordance with one or more embodiments. The same reference numerals used in the schematic illustration of the backplane 650 are employed to designate similar elements in the alternative backplane 670. In this exemplary embodiment, highly doped source/drain regions 672 are formed within the active areas 626. Ion implantation through a mask can be employed to form the source/drain regions 672, leaving the channel region of the transistor at a lower doping level than the source/drain regions. The ohmic contacts 636 are formed on the source/drain regions 672. The highly doped source/drain regions 672 facilitate the formation of ohmic contacts 636 with a low contact resistance. As known in the art, a metal layer may form an ohmic contact to a highly doped silicon layer regardless of the workfunction of the metal layer. The doping concentration of the highly doped regions 672 is preferably larger than $10^{19}$ cm$^{-3}$ and more preferably larger than $10^{20}$ cm$^{-3}$.

Figure 17:
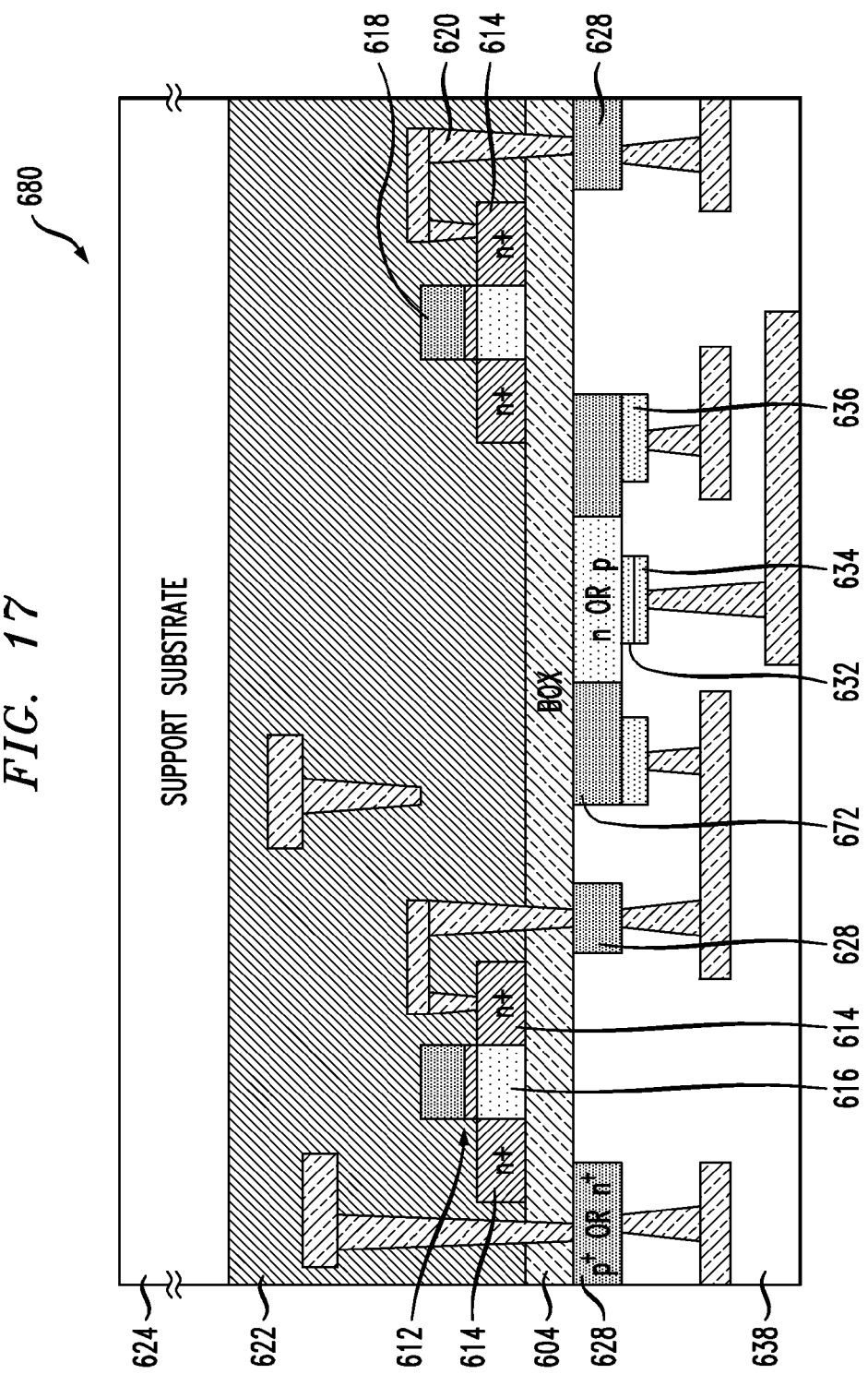
FIG. 17 is a schematic, sectional illustration showing a third alternative embodiment of an active matrix structure.

FIG. 17 shows a further alternative embodiment of a backplane 680 provided in accordance with one or more embodiments. The same reference numerals used in the schematic illustrations of the backplanes 650 and 670 are employed to designate similar elements in the alternative backplane 680. In this exemplary embodiment, highly doped regions are formed in the n or p-type semiconductor layer 608 to provide both source/drain regions 672 and contact regions 628 adjoining the BOX layer. The contact regions 628 and source/drain regions 672 are formed simultaneously in one or more embodiments through the same mask prior to formation of the CMOS transistors 612. The handle substrate is patterned into the active areas and contact regions 628. The ohmic contacts and gate structures are then formed on the source/drain and channel regions, respectively, of the resulting HEMT transistors.

Given the discussion thus far and with reference to the exemplary embodiments discussed above and the drawings, it will be appreciated that, in general terms, an exemplary high electron mobility transistor is provided that includes a doped, inorganic semiconductor layer (32 in FIG. 2), a gate electrode 35, an organic semiconductor barrier layer 36 in FIG. 2) operatively associated with the gate electrode, and ohmic contacts on the inorganic semiconductor layer. The organic barrier layer 36 is positioned between the gate electrode and the inorganic semiconductor layer. The barrier layer of the exemplary high electron mobility field-effect transistor further includes one or more organic layers wherein at least one organic layer serves electron blocking function and at least one organic layer serves hole blocking function. As discussed above, electron and hole blocking functions are performed by discrete layers in some embodiments and by a single layer in other embodiments. The electron blocking layer impedes the transfer of electrons between the gate electrode 35 and the inorganic semiconductor layer 32 while the hole blocking layer impedes the transfer of holes between the gate electrode 35 and the inorganic semiconductor layer 32. A passivation layer 39 is provided in one or more embodiments. The passivation layer can perform several functions as described above, including the saturation of dangling bonds at the surface of the inorganic semiconductor substrate 32. The organic semiconductor barrier layer includes pentacene in one or more embodiments where the inorganic substrate is n-type and the pentacene layer serves to block electrons. A gate junction structure comprising carrier blocking layer(s) and passivation layer consists essentially of organic materials in one or more embodiments.

An exemplary method includes obtaining a high electron mobility field-effect transistor comprising an inorganic semiconductor layer 32, a gate electrode 35, first and second ohmic contacts 33A, 33B operatively associated with the inorganic semiconductor layer, and an organic gate barrier layer 36 operatively associated with the gate electrode 35, the organic gate barrier layer being positioned between the gate electrode 35 and the inorganic semiconductor layer 32 and including one or more organic semiconductor layers operative to block electrons and holes. A two dimensional electron gas layer is formed in the inorganic semiconductor layer between the source and drain electrodes and the high electron mobility field-effect transistor provides electrical current to an electronic device. FIGS. 6-9 discloses exemplary circuits wherein a hybrid HEMT as disclosed herein provides current to an OLED.

An exemplary structure includes an array of high electron mobility field-effect transistors, each of the high electron mobility field-effect transistors including: an inorganic semiconductor layer 32, a gate electrode 35, first and second ohmic contacts 33A, 33B operatively associated with the inorganic semiconductor layer 32, and a gate barrier layer 36 operatively associated with the gate electrode, the gate barrier layer being positioned between the gate electrode 35 and the inorganic semiconductor layer 32 and including an organic semiconductor layer(s) for suppressing the injection of electrons and holes. The exemplary structure further includes an array of thin film switching transistors 22, each of the thin film switching transistors being electrically connected to one of the high electron mobility field-effect transistors 26. An array of electronic devices 28 is electrically connected to the high electron mobility field-effect transistors. FIG. 1 shows an exemplary structure wherein the driver TFTs 26 are high electron mobility field-effect transistors, such as shown in FIGS. 2, 3A and 3B.

A further exemplary method includes obtaining a substrate including a first inorganic semiconductor layer 602, a handle substrate 606, and an electrically insulating layer 604 between the first inorganic semiconductor layer and the handle substrate. A doped, second inorganic semiconductor layer 608 is formed from a region of the handle substrate adjoining the electrically insulating layer. An array of transistors 612 is formed using the first inorganic semiconductor layer. The method further includes forming a plurality of via conductors 620 through the electrically insulating layer 604, at least some of the via conductors being electrically connected to the transistors 612, forming a protective layer 622 over the transistors, attaching a support substrate 624 (FIG. 12) to the protective layer, forming a plurality of discrete active areas 626 from the doped, second inorganic semiconductor layer, and forming an array of high electron mobility field-effect transistors 630 using the discrete active areas, such as shown in FIG. 13. Each high electron mobility field-effect transistor includes an organic gate barrier layer 632 directly contacting one of the active areas, a gate electrode 634 on the gate barrier layer, and ohmic contacts 636. Each gate barrier layer includes an organic semiconductor layer for suppressing the injection of the charge carriers (electrons and holes) from the gate electrode 634 into the inorganic semiconductor layer 608. The method further includes forming a second protective layer 638 over the junction field-effect transistors 630 (FIG. 14) and forming a plurality of electrical conductors 640 within the second protective layer electrically connecting the junction field-effect transistors to the via conductors electrically connected to the first array of transistors. A structure as shown in at least one of FIGS. 14-17 can accordingly be obtained. In one or more embodiments, the method further includes the steps of forming the barrier layer as a plurality of organic semiconductor layers for suppressing the injection of both holes and electrons. A passivating layer is formed directly on the second inorganic semiconductor layer in some embodiments. Gate barrier layers as shown in the exemplary embodiments of FIGS. 2, 3A and 3B can accordingly be provided within one or more of the structures shown in FIGS. 14-17. Highly doped contact regions 628 are formed in some embodiments. Highly doped source/drain regions 672 are formed in the active areas in one or more embodiments such as the embodiment 670 of FIG. 16.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above", "below", "top" and "bottom" are generally employed to indicate relative positions as opposed to relative elevations unless otherwise indicated. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A high electron mobility field-effect transistor comprising:
   an inorganic semiconductor layer;
   a gate electrode;
   first and second ohmic contacts operatively associated with the inorganic semiconductor layer, and
   an organic gate barrier layer operatively associated with the gate electrode, the organic gate barrier layer being positioned between the gate electrode and the inorganic semiconductor layer and including one or more organic semiconductor layers operative to block electrons and holes,
   wherein the organic gate barrier layer includes a first organic semiconductor layer comprising a first material for blocking holes and a second organic semiconductor layer comprised of a second material for blocking electrons, the first material being different from the second material.

2. The high electron mobility field-effect transistor of claim 1, wherein the inorganic semiconductor layer comprises an n-type crystalline silicon layer.

3. The high electron mobility field-effect transistor of claim 2, wherein the gate electrode includes a layer of high workfunction material.

4. The high electron mobility field-effect transistor of claim 3, wherein the gate junction structure further includes a discrete organic passivation layer directly contacting the inorganic semiconductor layer.

5. The high electron mobility transistor of claim 3, wherein the first organic semiconductor layer adjoins the gate electrode and the second organic semiconductor layer is positioned between the first organic semiconductor layer and the inorganic semiconductor layer.

6. The high electron mobility field-effect transistor of claim 3, wherein the inorganic semiconductor layer comprises a crystalline silicon layer, further including a buried oxide layer adjoining the inorganic semiconductor layer.

7. The high electron mobility field-effect transistor of claim 1, wherein the inorganic semiconductor layer is p-type.

8. The high electron mobility field-effect transistor of claim 1, further including an organic passivation layer in direct contact with the inorganic semiconductor layer.

* * * * *